(12) United States Patent
Ocker et al.

(10) Patent No.: US 11,519,065 B2
(45) Date of Patent: Dec. 6, 2022

(54) METHOD OF COATING SUBSTRATES

(71) Applicant: Singulus Technologies AG, Kahl am Main (DE)

(72) Inventors: Berthold Ocker, Hanau (DE); Wolfram MAAß, Linsengericht (DE); Oliver Hohn, Gründau (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 348 days.

(21) Appl. No.: 16/703,950

(22) Filed: Dec. 5, 2019

(65) Prior Publication Data
US 2020/0224306 A1 Jul. 16, 2020

(30) Foreign Application Priority Data
Dec. 6, 2018 (EP) .................................. 18210778

(51) Int. Cl.
C23C 14/54 (2006.01)
C23C 14/34 (2006.01)
G01B 11/06 (2006.01)

(52) U.S. Cl.
CPC ............ C23C 14/545 (2013.01); C23C 14/34 (2013.01); G01B 11/0683 (2013.01)

(58) Field of Classification Search
CPC ... C23C 14/545; C23C 14/34; C23C 14/3492; C23C 14/50; C23C 14/54; C23C 14/35; C23C 14/568; G01B 11/0683; H01J 37/32926; H01J 37/3299; H01J 37/347; H01J 37/32752; H01J 37/32568; H01L 21/02266; H01L 21/02282; H01L 21/56; H01L 21/67017; H01L 21/6715; H01L 22/12
See application file for complete search history.

(56) References Cited

U.S. PATENT DOCUMENTS

| | | | |
|---|---|---|---|
| 7,799,179 B2 | 9/2010 | Maass et al. | |
| 9,347,131 B2 | 5/2016 | Maass et al. | |
| 2012/0114837 A1* | 5/2012 | Nakagawa | C23C 14/24 427/9 |

FOREIGN PATENT DOCUMENTS

| | | | | |
|---|---|---|---|---|
| JP | 62180063 A | * | 8/1987 | |
| WO | 03/071579 A1 | | 8/2003 | |
| WO | WO-2008015159 A1 | * | 2/2008 | ........... C23C 14/542 |
| WO | 2012/041920 A1 | | 4/2012 | |
| WO | 2012/072120 A1 | | 6/2012 | |

OTHER PUBLICATIONS

WO-2008015159-A1 Translation (Year: 2008).*
JP-62180063-A Translation (Year: 1987).*

* cited by examiner

*Primary Examiner* — Jennifer Wecker
*Assistant Examiner* — Patrick S Ott
(74) *Attorney, Agent, or Firm* — Ohlandt, Greeley Ruggiero and Perle, LLP

(57) ABSTRACT

The disclosure relates to a method of determining a velocity profile for the movement of a substrate to be coated relative to a coating source.

19 Claims, 11 Drawing Sheets

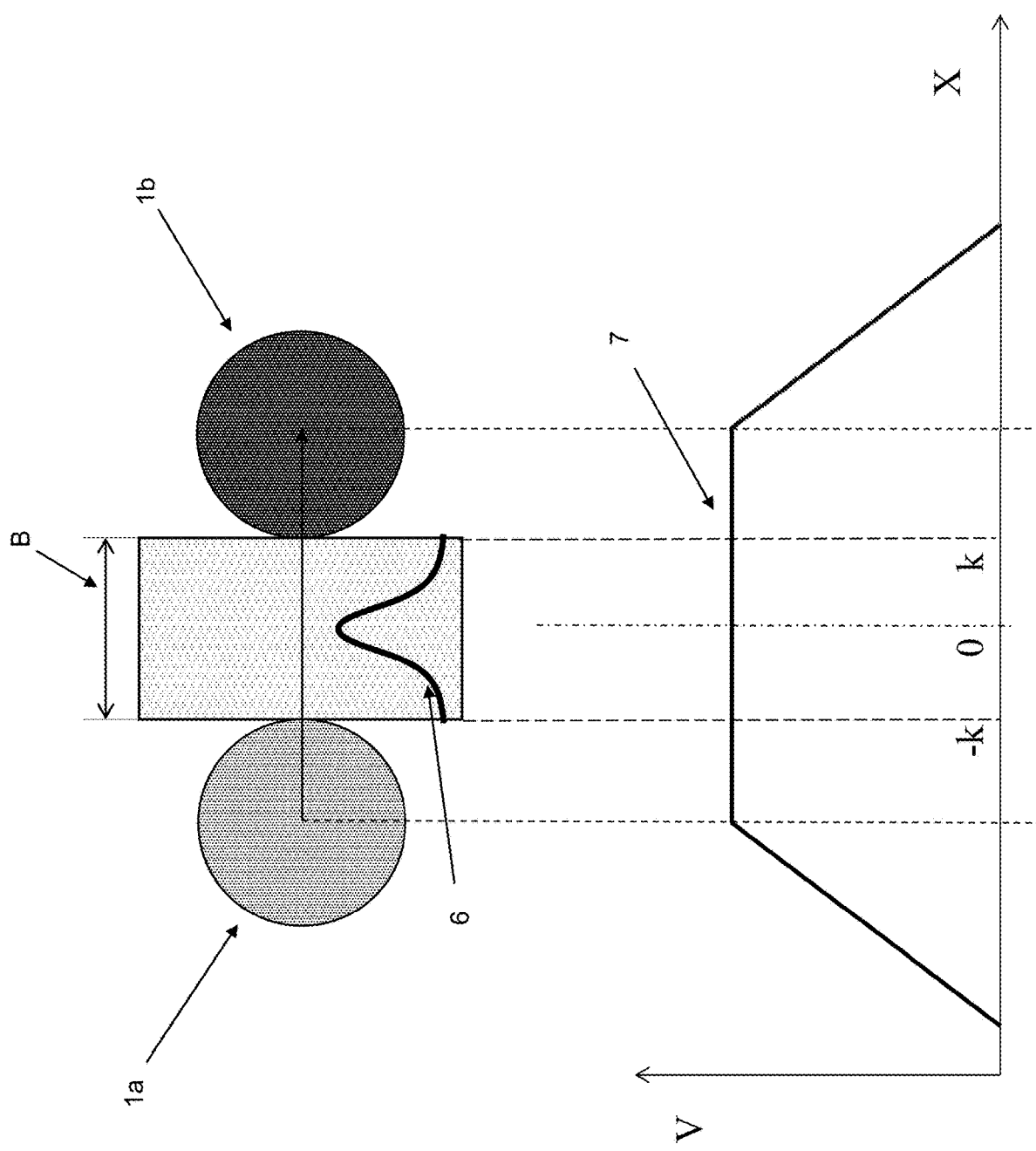

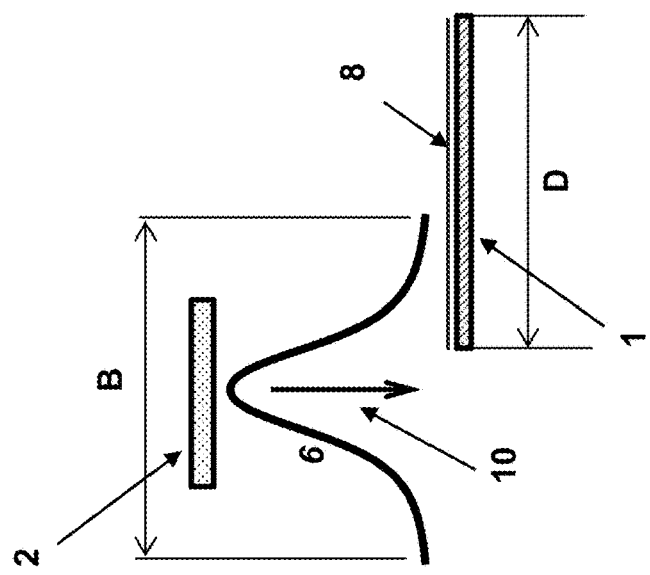
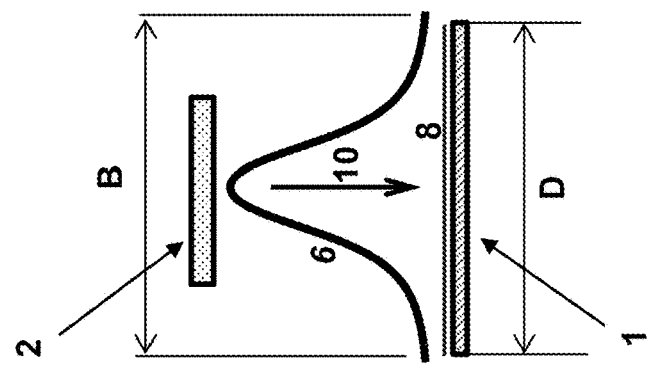
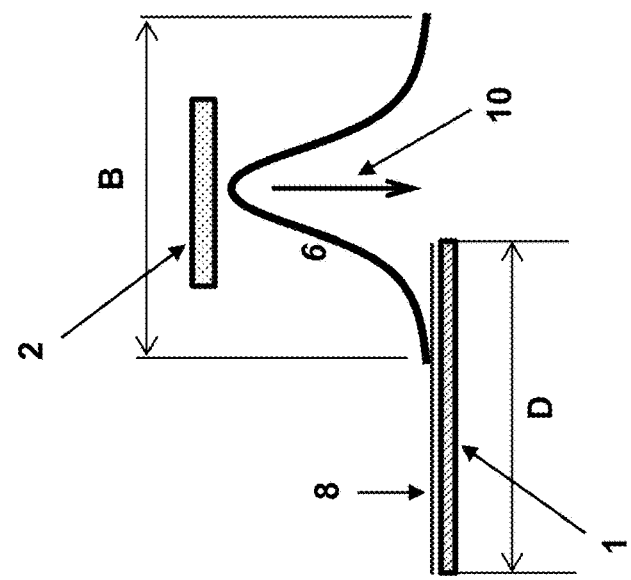
Fig. 5a (Prior Art)
Fig. 5b (Prior Art)
Fig. 5c (Prior Art)

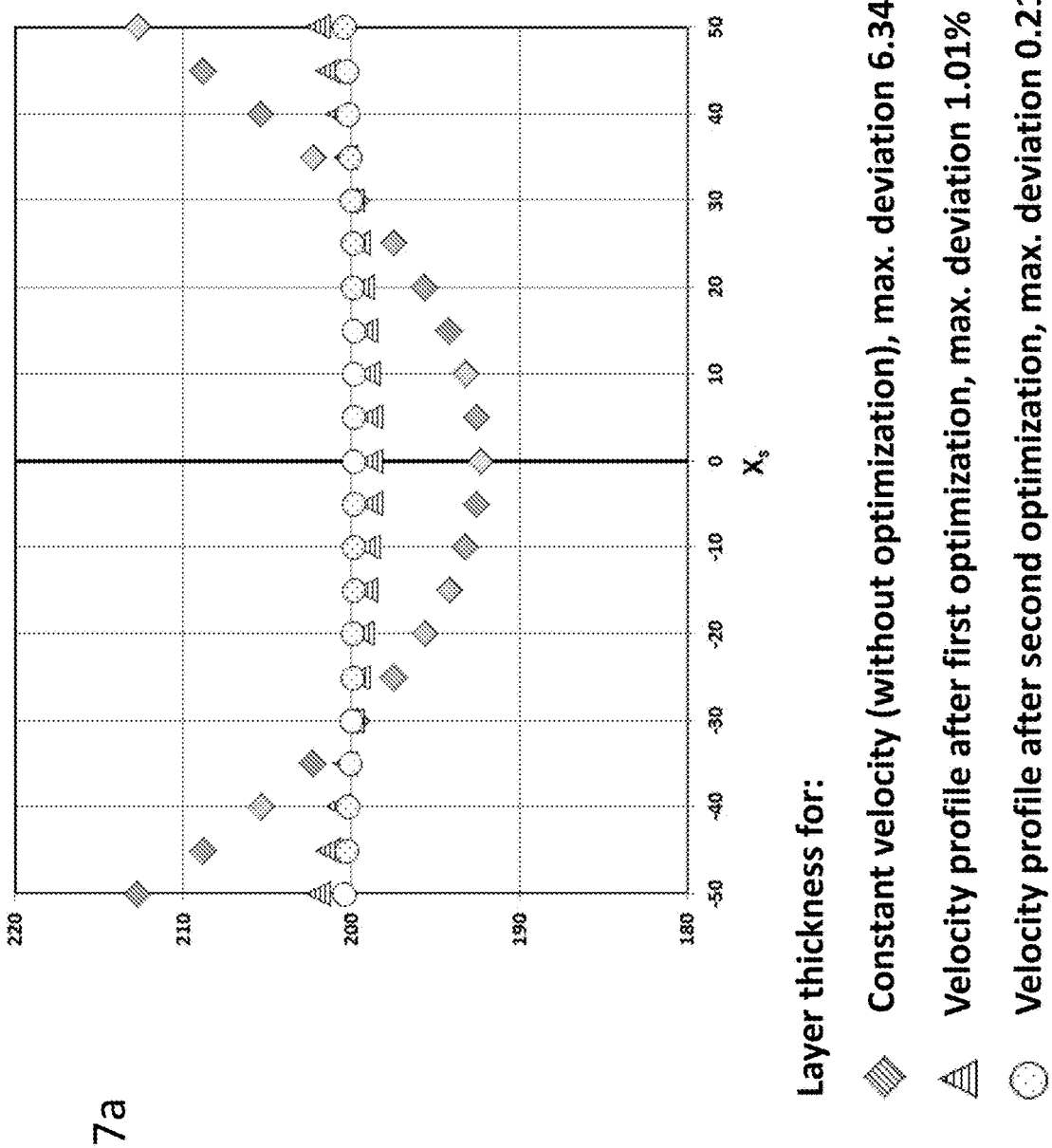

METHOD OF COATING SUBSTRATES

CROSS-REFERENCED APPLICATIONS

This application claims priority to European Patent Application No. 18210778.9, filed on Dec. 6, 2018, which is incorporated herein in its' entirety by reference thereto.

BACKGROUND

1. Field of the Disclosure

The disclosure relates to a method of determining a velocity profile for the movement of a substrate to be coated relative to a coating source as well as to a device and method of coating a substrate, in particular of coating a substrate with thin layers of magnetic or non-magnetic materials, with the aim of achieving extremely good layer thickness uniformity on large substrates under production conditions. The substrate sizes to be considered are, e.g., silicon wafers having a diameter of 300 mm in the semiconductor industry. The transition to wafer sizes having a diameter of 450 mm is currently taking place. Extremely high requirements are made on the layer thickness uniformity, e.g., in the production of TMR (tunnel magnetoresistance) layer systems. In these systems, the tunnel barrier must have a thickness of only 1 nm or even less and at the same time deviations from the target layer thickness of less than 0.1% over the entire substrate size are required for the homogeneity of the TMR effect. The production of EUV (extreme ultraviolet) mirrors is another application involving the production of very thin layers having extremely good layer thickness uniformity. Also, in the production of solar cells for photovoltaic systems using thin-film technology, thin layers are deposited onto large substrates in individual process steps using cathode sputtering. Although the requirements for the layer thickness uniformity are here far less stringent than in the semiconductor industry, good homogeneity of the layers improves the performance of these photovoltaic modules. For these and other applications, the disclosure presented here can basically be advantageously applied.

2. Discussion of the Background Art

WO 03/071579 A1 discloses a device for coating substrates in which a rectangular long cathode is used and in which the substrates are moved through the coating range of the cathode in a straight line and perpendicular to the longitudinal orientation and at a defined distance of the cathode. This method is called "linear dynamic deposition" (LDD). This method makes it possible to deposit extremely thin layers (down to a layer thickness of less than 1 nm) with very good layer thickness uniformity to large substrates (Ø300 mm technically implemented). The method can be applied to all materials which can be coated by cathode sputtering. Further advantages of the LDD method are described, e.g., in WO 2012/041920 A1.

It is characteristic of the linear dynamic deposition method that elongated magnetron cathodes are used for the coating operation. These are cathodes with a rectangular target in which permanent magnets are used to generate a specific magnetic field in order to increase the sputtering effect. A schematic view of such an arrangement is exemplarily illustrated in FIG. 1. Due to the structure of these cathodes, the minimum width of the target can hardly be less than about 50 mm. Typical target widths in the industrial sector are between 80 mm and 150 mm. Depending on the application and the installation type, the target widths can also be larger. The range in the direction of the target width in which the coating takes place is considerably larger than the target width itself. This range is mainly determined by, i.e., the distance between the target and the substrate. For practical reasons, however, this area is usually limited by screens. A coating range that is twice as large as the target width is typical.

The term "elongated cathode" means that the length of the rectangular target is at least twice the width. Typically, however, the length is about four times the width.

In the industrial sector, especially in the semiconductor industry, the substrates are round silicon wafers. These wafers have a diameter of 200 mm or 300 mm. Some large semiconductor manufacturers already use wafers having a diameter of 450 mm. This results in a typical ratio of 0.5 to 3 or greater for the wafer diameter to the coating range.

In the prior art, there are different approaches to control the thickness of deposited layers. WO 2012/072120 A1, for example, discloses a method in which, e.g., the thickness of the already deposited layer is measured and the coating parameters are adjusted in a closed loop. However, the problem of achieving extremely good layer thickness uniformity with the LDD method or similar methods was not solved in the prior art. The present disclosure now provides an improved method (as well as an improved device for carrying out this method) which takes account of this problem. The solution to the problem essentially consists in determining the position dependence of the velocity of the substrate $v(x_m)$ in such way that the required layer thickness uniformity is achieved by using measured values of the position dependence of the layer thickness. The determination of this velocity dependence is based on the physics of the coating process of practical coating set-ups (see above).

For the above specified geometric conditions, the method also allows to manufacture predetermined thickness profiles in the direction of movement of the substrate by means of the determination of $v(x_m)$ according to the disclosure presented.

In the case of the LDD method, the relation $d \sim 1/v$ holds for the layer thickness d at a constant substrate speed v, i.e. the layer thickness of the applied layer is smaller at a higher substrate speed. The position dependence of the layer thickness in the direction of movement of the substrate is described in the general case for a variable speed by the following formula:

$$d(x'_s) = \int_{-\infty}^{\infty} \frac{R(x'_s; x_m)}{v(x_m)} dx_m \qquad (1)$$

The coordinates used are explained in FIG. 3. $x_m$ is the position of the center of the substrate in the "cathode system", and $x'_s$ is the position on the substrate in the "substrate system". ±w are the limits of the substrate in the x-direction. $R(x'_s; x_m)$ is the deposition rate, which depends on the position of the substrate point $x'_s$ under the cathode (or another coating source). In general—this is what leads to the problem underlying the present disclosure—the course of $R(x'_s; x_m)$ changes depending on the position $x_m$ of the substrate. The resultant influence on the dependence of the layer thickness across the width of the substrate (i.e., on $x'_s$) will be analyzed in the following. $v(x_m)$ is the velocity of the substrate relative to the position $x_m$ of the center of the substrate in the cathode system, by means of which this position dependence can be influenced.

In equation (1), the very general (and "theoretical") case is described that the rate R extends over an infinite range. In all practical applications, however, the range in which material is deposited from the cathode is, of course, limited. If the limits of this coating range are denoted by ±k (see FIGS. 1, 2 and 3), equation (1) results in $$d(x'_s) = \int_{-k-x'_s}^{k-x'_s} \frac{R(x'_s + x_m; x_m)}{v(x_m)} dx_m \quad (1a)$$

and $$d(x'_s) = \int_{-k}^{k} \frac{R(x^*; x^* - x'_s)}{v(x^* - x'_s)} dx^* \quad (1b)$$

The lower and upper limits of the integral in equation (1a) result from the "ingression" of the position $x'_s$ into the coating range and from leaving the coating range, respectively. Equation (1b) results from a coordinate transformation. The variables $x_m$ and $x^*-x'_s$ after the semicolon in equations (1a) and (1b), respectively, describe the effect of the change in the magnitude of R by the movement of the substrate. Without the influence of the movement of the substrate on the rate distribution R or when neglecting this influence, the variables $x_m$ and $x^*-x'_s$ after the semicolon are omitted and, in anticipation of the following, the relation $R(x^*; x^*-x'_s) \equiv R_g(x^*)$ holds. Thus, it follows from equation (1b) that there should be no position dependence of the layer thickness d in the case of a constant velocity $v(x^*-x'_s)=v_0$:

$$d_m = \frac{1}{v_0} \int_{-k}^{k} R_g(x^*) dx^* = \frac{C_g}{v_0} \quad (2)$$

wherein $C_g = \int_{-k}^{k} R_g(x^*)dx^*$. Thus, a "device constant" is defined by $C_g$. Likewise in anticipation of the following, $d_m$ denotes the average measured layer thickness. Therefore, without this already mentioned influence of the movement of the substrate, a layer thickness homogeneity in the direction of movement without deviations should be achievable according to equation (2) with the LDD method even if the coating range defined by ±k is in the same size as the substrate dimension in the direction of movement. In the technical implementation of a corresponding device (vacuum coating system), a long cathode having a finite longitudinal extension perpendicular to the direction of movement of the substrate (length>>substrate dimension perpendicular to the direction of movement) must, of course, be used. An inherent deviation of the layer thickness in the direction of the longitudinal extension of the cathode can essentially be compensated for by the use of so-called aperture shapers.

In practice—despite an absolutely uniform velocity of the substrate—there are nevertheless small deviations from the target layer thickness in the direction of movement of the substrate, which cannot be explained by the geometric structure of the LDD coating device according to equation (2). In the case of sputtering cathodes, the causes of this non-homogeneity of the layer thickness are very likely small fluctuations in the density of the sputtering plasma, caused by changes in the impedance of the cathode arrangement during the movement of the substrate or by minimal changes in the gas pressure in the area of the plasma during the movement. These effects are thus not caused by the geometry of the cathode-substrate ensemble, but by the movement of the substrate itself. Also, in the case of other coating sources, the immediate surroundings of the source change due to the movement of the substrate, which in practice leads to an influence on the deposition rate.

Due to these effects, it is extremely difficult to improve the layer thickness uniformity, e.g., when producing a layer with a constant layer thickness, to a deviation of less than 0.5% and in particular less than 0.3%. However, as initially explained, various applications of the LDD coating method require deviations from the target layer thickness of down to less than 0.1% to be achieved on large substrates.

Therefore, it is in particular an object of the present disclosure to provide an improved method with which the layer thickness uniformity can be better controlled.

SUMMARY

Accordingly, the present disclosure is directed to a method of determining a velocity profile for the movement of a substrate to be coated relative to a coating source during a coating operation of the substrate in order to achieve a defined target layer thickness profile. The method comprises the steps of:
(a) describing the deposition rate depending on the substrate coordinates and depending on the position of the substrate relative to the coating source by an approximation function comprising several parameters;
(b) describing the velocity profile to be determined by an approximation function comprising one or more parameters;
(c) coating a substrate using a defined velocity profile, wherein the substrate to be coated is moved during the coating process relative to the coating source in a straight line along a first direction using this velocity profile;
(d) measuring the actual layer thickness profile of the coated substrate achieved by the coating process;
(e) determining one or several of the parameters of the approximation function for the deposition rate based on a comparison of the measured actual layer thickness profile with the defined target layer thickness profile; and
(f) determining the velocity profile by determining one or several of the parameters of the approximation function for the velocity profile to be determined on the basis of the parameter(s) determined in step (e).

The object discussed above is achieved according to the disclosure in that the position dependence of the velocity of the movement of the substrate through the coating range of the cathode is changed such that the deviations between the defined target layer thickness profile and the actual layer thickness profile are compensated for. The velocity profile necessary therefor is determined according to the disclosure in that the deposition rate is described by an approximation function whose parameters are determined by a comparison with a measurement of the layer thickness profile obtained by a coating operation, which in turn allows the velocity profile to be determined on the basis of the approximated deposition rate.

In other words, the method according to the disclosure is used to determine an optimized velocity profile, which takes place (by performing one or more test depositions) prior to the actual coating operation of the substrates during the actual manufacturing process. An optimized velocity profile is determined by means of the method so that during the actual manufacturing process the substrate is moved during the coating operation along the first direction at a variable velocity according to this velocity profile determined according to the disclosure in order to obtain a coating having a target layer thickness profile defined along the first direction. In particular, according to the present disclosure—contrarily to the description, for example, in WO 2012/072120 A1—the velocity of the substrate will not be controlled during the coating process based on a simultaneously performed layer thickness measurement (i.e. in a closed loop). Rather, the predetermined velocity profile is already fixed before the actual coating process, whereby a minimum deviation from the defined target layer thickness profile or, in the special case, a greater homogeneity of the layer thickness over the entire substrate can be achieved.

The measurement of the actual layer thickness profile achieved by a coating process (according to step (d)) can be carried out by already known methods. In the case of conductive layers, it is typically the conductivity of the layer that is measured (e.g., by means of a "4-point probe"), which is proportional to the layer thickness. Other methods are based on optical properties of the layer (e.g. densitometry, ellipsometry).

The method according to the disclosure allows in particular also to achieve an optimized layer thickness profile in the case of extended sources. For example, it is preferred that the coating process is performed by the coating source in a coating range which is extended in the first direction of movement and whose extension along the first direction of movement is at least 100 mm, preferably at least 200 mm and particularly preferably at least 300 mm. If, for example, the defined target layer thickness profile is to be a constant layer thickness, the method according to the disclosure still leads to excellent results even if the coating operation is carried out by the coating source in a coating range extended in the first direction of movement with a first extension, the substrate has a second extension in this first direction of movement and the ratio of the first extension to the second extension is at least 0.2, preferably at least 0.3, more preferably at least 0.5 and particularly preferably at least 1.0. This also applies to defined target layer thickness profiles having a variable layer thickness, wherein the substrate extension is to be replaced by a characteristic length of the profile. This means that the coating operation is carried out by the coating source in a coating range which is extended in the first direction of movement with a first extension, that the defined target layer thickness profile has a characteristic length along this first direction of movement and that the ratio of the first extension to the characteristic length is at least 0.2, preferably at least 0.3, more preferably at least 0.5 and particularly preferably at least 1.0. The length over which the layer thickness according to the target layer thickness profile changes significantly, i.e., by 10% (or alternatively by 20% or by more than 30%) is understood as the "characteristic length". In the case of a profile having a linearly increasing layer thickness (or also a constant layer thickness), the characteristic length would be identical to the substrate extension. In the case of a "hard" step (cf., e.g., FIG. 4e), the characteristic length would be zero. In the case of a target layer thickness profile in which an as good as achievable absolute constant layer thickness has to be achieved, it is possible to produce layers according to the disclosure in which the deviation between the measured and the target layer thickness (i.e., between the actual layer thickness profile on the coated substrate and the defined target layer thickness profile), if necessary after several iterations, is less than 1.0%, preferably less than 0.5%, more preferably less than 0.3% and particularly preferably less than 0.1%.

A percent value for the deviation between the measured actual layer thickness profile of the coated substrate and the defined target layer thickness profile can be determined according to the disclosure as follows: The layer thickness of the coated substrate is measured at a plurality of points of the substrate surface. The measurement is carried out preferably at at least 10 points, more preferably at at least 50 points, particularly preferably at at least 100 points, wherein the measuring points are preferably uniformly distributed over the substrate area along a line parallel to the direction of movement of the substrate, for example, at a centrally arranged line comprising, e.g., 10 points constantly spaced apart from each other. Each of the measured layer thicknesses at these points is then compared with the corresponding layer thickness according to the target layer thickness profile, and the squares of the differences each divided by the corresponding target layer thickness are summed up for all measuring points (sum of the deviation squares (cf. equation 6a)). The percent value for the deviation is then given by the square root of the resulting sum.

Preferably, the deposition rate and its dependence on the substrate coordinates and on the position of the substrate relative to the coating source is approximated by a product of at least two functions. The product preferably contains as a first factor a function which accounts for the geometric set-up and depends only on the geometric arrangement of the coating source (i.e., e.g., width of the source, distance from the substrate plane, environment of the source, etc.) and is independent of the position of the substrate relative to the coating source, and as a further factor a function which accounts for the movement of the substrate and depends only on the position of the substrate relative to the coating source and is independent of the geometric arrangement of the coating source. Each of the at least two functions (or just one of the functions) is preferably described by an approximation function whose concrete course is defined by one or more parameters. It is particularly preferred that the velocity profile to be determined is also described by an approximation function whose concrete course is defined by one or more parameters. A polynomial can be used for each of one or more, preferably all, approximation functions. However, other functions are also available as alternative approximation functions, such as cubic splines algorithms.

Steps (a) to (f) are preferably repeated, preferably several times, wherein the parameters of the previous run determined in step (e) are used in step (a) of the subsequent run, and the defined velocity profile in step (c) of the subsequent run corresponds to the velocity profile determined in step (f) of the previous run.

The coating source is preferably a PVD source, more preferably a sputtering cathode and particularly preferably a long cathode and/or a rectangular cathode with a long axis and a short axis, wherein the first direction is oriented perpendicularly to the long axis.

The present disclosure is also directed to a method of coating a substrate. Firstly, a velocity profile is determined for the movement of the substrate to be coated relative to a coating source in order to achieve a defined target layer thickness profile, as described above. Subsequently, the substrate is coated using this previously determined velocity profile, wherein, during the coating operation, the substrate to be coated is moved relative to the coating source in a straight line along a first direction using this velocity profile.

The defined target layer thickness profile is preferably a constant layer thickness and for the defined velocity profile preferably also a constant velocity is selected at which the envisaged average layer thickness is already deposited.

Since the deposition rate of the coating source depends on the position of the substrate relative to the coating source and thus influences the layer thickness distribution on the substrate, the velocity profile is determined according to steps (a) to (f) such that the effect on the layer thickness distribution generated by the variation in the deposition rate of the coating source is at least partially compensated for by the variation in the velocity of the substrate.

The present disclosure is further directed to a device for coating a substrate comprising a coating source, a substrate support adapted to move a substrate to be coated relative to the coating source in a straight line along a first direction during the coating operation, and a control unit adapted and configured to vary the velocity of the substrate along the first direction during the coating operation according to a predetermined velocity profile depending on the position of the substrate in order to obtain a coating having a target layer thickness profile defined along the first direction, wherein the control unit is adapted and configured to determine the predetermined velocity profile according to the method described above.

BRIEF DESCRIPTION OF THE DRAWINGS

Preferred embodiments of the present disclosure are described in more detail below with reference to the Figures, wherein:

FIG. 2 schematically shows the movement of the substrate through the coating range during an LDD coating operation as well as the associated velocity profile;

FIG. 5a schematically shows an LDD coating operation according to the prior art;

FIG. 5b schematically shows an LDD coating operation according to the prior art;

FIG. 5c schematically shows an LDD coating operation according to the prior art;

FIG. 7a shows measured layer thicknesses for different velocity profiles; and

FIG. 7b shows the velocity profiles belonging to FIG. 7a.

DETAILED DESCRIPTION OF THE PREFERRED EMBODIMENT

Figures 1A, 1B:
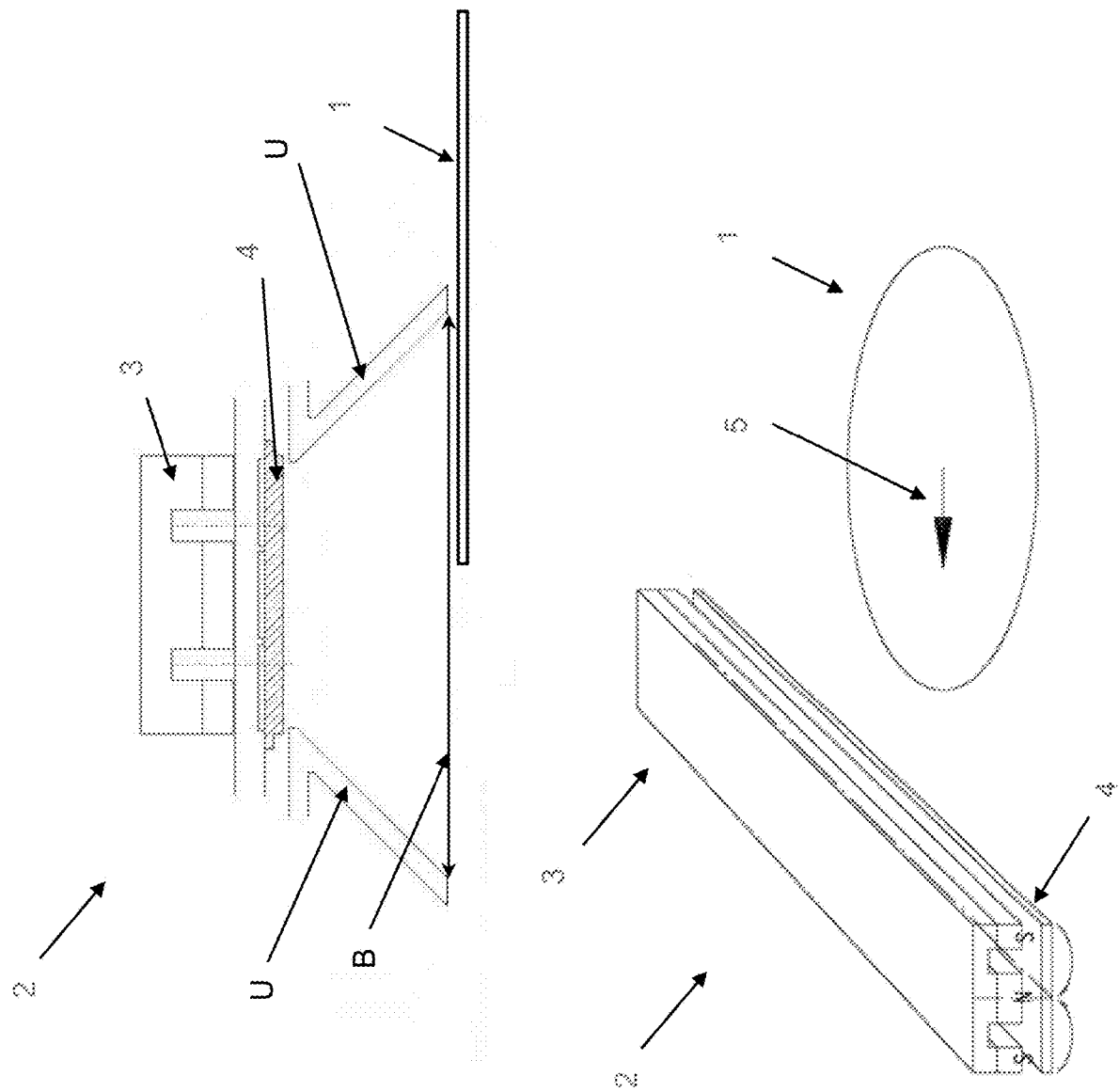
FIG. 1a schematically shows the geometry of an LDD coating operation in a cross-sectional view for the case of a magnetron sputtering cathode.
FIG. 1b schematically shows the geometry of the LDD coating operation according to FIG. 1a in a perspective view.

FIG. 1 schematically shows the geometry of a conventional LDD coating method both in a cross-sectional view (FIG. 1a) and in a perspective view (FIG. 1b), in which a substrate 1 is moved relative to a sputtering cathode 2 comprising a magnet array 3 and a sputtering target 4. The linear movement of the substrate 1 along a first direction relative to the sputtering cathode is indicated by the arrow 5 on the substrate 1. In this Figure, the sputtering cathode 2 is a long cathode whose long axis is perpendicular to the direction of movement of the substrate 1. The reference sign B (cf. FIG. 1a) indicates the coating range and the reference sign U (cf. FIG. 1a) indicates the vicinity of the cathode (e.g. shielding plates).

FIG. 2 schematically shows the movement of the substrate 1 through the coating range B, wherein, prior to the coating operation, the substrate 1a moves through the coating range B in a straight line along the arrow, and, after the coating operation has been performed, is provided with the reference sign 1b. The static deposition rate is schematically indicated by the curve 6. At the bottom of FIG. 2, the velocity profile 7 of the substrate is shown with respect to the sputtering cathode, wherein in the present case the velocity profile 7 has an area with a constant velocity corresponding to that part of the profile in which a coating operation takes place.

In the following, a particularly preferred embodiment for an algorithm for determining the velocity profile 7 will be explained in detail. Even if the following embodiment is directed to the special case of the LDD coating method using a sputtering cathode, this algorithm can analogously be applied for other coating sources and in particular PVD sources.

Since, as explained above, a certain degree of layer thickness uniformity can already be achieved with the LDD method even without the method described herein, a rate distribution of the following form is assumed hereinafter to simplify matters:

$$R(x_k; x_m) = R_g(x_k) * P_v(x_m) \quad (3)$$

$R_g(x_k)$ is the rate distribution unaffected by the movement of the substrate as a function of the position under the cathode $x_k$. $P_v(x_m)$ describes the effect of the substrate movement on the total distribution and has a value in the order of 1, since this effect is not large. This also justifies the approach according to equation (3). Thus, equation (1a) and equation (1b) respectively result in $$d(x'_s) = \int_{-k-x'_s}^{k-x'_s} \frac{R_g(x'_s + x_m) * P_v(x_m)}{v(x_m)} dx_m \quad (1c)$$

and $$d(x'_s) = \int_{-k}^{k} \frac{R_g(x^*) * P_v(x^* - x'_s)}{v(x^* - x'_s)} dx^* \quad (1d)$$

In the case of $v(x^* - x'_s) = v_0$, equation (1d) likewise results in relation (2). An improvement of the layer thickness uniformity to a deviation of below 0.5% and in particular of significantly below 0.5% is extremely difficult due to the effects discussed at the beginning, in particular when the coating range between ±k is an extended range, which is always the case in practice. However, various applications of the LDD coating method—some of which have already been mentioned at the beginning—require deviations from the target layer thickness of down to less than 0.1% on large substrates.

From relation (1c), as will be shown in the following, a method of determining the course of the velocity $v(x_m)$ can be derived by means of which predetermined profiles of the layer thickness $d(x_s)$ can be achieved with minimum effort. In particular, (even extremely small) deviations from a target layer thickness can be compensated for and thus extremely good layer thickness uniformity can be achieved. It is essential—and this is one of the advantages of the present disclosure—that the method can be applied to the case which is always existing in practice, i.e., the case in which the extension of the coating range from $-k$ to $+k$ is approximately of the same order of magnitude as the extension of the substrate from $-w$ to $+w$. Previously known methods similar to LDD technology, in which a layer thickness adjustment is to be achieved by varying the substrate velocity, are always based on a coating range that is very small compared to the substrate ($k \ll w$)—usually without explicitly mentioning this.

In DE 10 2006 036 403 A1, for example, a heuristic relation is described which takes account of the self-evident relation $d \sim 1/v$ (see above). This relation can be in principle derived as a special case of the method presented herein from equation (1a) for an infinitely small coating range $k \to 0$ $$d_i(x'_s) = 2*k*R(0; -x'_s)/v_i(-x'_s), \quad (4a)$$

wherein the index I already takes into account the i-th step of the iteration for the optimization of the layer thickness as described in DE 10 2006 036 403 A1. With $d_i(x'_s)*v_i(-x'_s) = 2*k*R(0, -x'_s)$ the next iteration step i+1 results in $$v_{i+1}(x'_s) = v_i(x'_s)*d_i(-x'_s)/d0 \quad (4b)$$

This is essentially the relation indicated in DE 10 2006 036 403 A1. $d_{i+1}(-x'_s)$ was replaced by the target layer thickness $d0$ of the iteration. The algebraic signs are due to the given geometry, in which the velocity of the entire substrate always refers to the center of the substrate. As noted in DE 10 2006 036 403 A1, this calculation method is for extended coating sources only an approximation, without defining the numerical limits of this approximation. The analysis of the geometric conditions immediately shows the problem, see FIG. 5: For an approximation according to equation (4b) to be carried out, the substrate point would have to be located in the very small coating range which is the prerequisite for the derivation of equation (4b) (see also FIG. 4b). In the case of the extended coating range addressed herein, this situation is not existent. For the calculation according to equation (4b), for example, the substrate point would have to be directly below the cathode center. In the case of this extended coating range, however, the substrate will be already coated when the front edge of the extended substrate is not yet below the cathode center (cf. FIG. 5a, reference arrow pointing downwards). Thus, it is not possible to determine a velocity according to equation (4b) in this situation. This is only possible when the substrate continues to move, namely as long as a point of the substrate moves below the cathode center (cf. FIG. 5b). After the rear edge of the substrate has left the cathode center (see FIG. 5c), the substrate velocity cannot be determined again. This analysis shows that even an approximate determination of v by means of the iteration according to equation (4b) or according to DE 10 2006 036 403 A1 is not possible for the practically always existing case of an extended coating range and extended substrates.

According to the disclosure, this problem is taken into account by the fact that the unknown functions $R(x^*; x^*-x'_s)$ or $R_g(x_k)$ and $P_v(x_m)$ can be approximately described by "simple" functions. The course of this "simple" function is determined by parameters which can be determined, if necessary also iteratively, by measuring the layer thickness of already coated substrates using standard methods. Using these "simple" functions and the parameters determined from the measured values, the velocity profile $v(x_m)$ can also be determined by approximation using the equations indicated above.

In the following, the derivation and description of the algorithm for obtaining an optimized velocity profile according to a preferred embodiment of the disclosure will be explained in detail. This algorithm is unrestrictedly applicable to the case important in the praxis of the LDD technology in which the coating range defined by $\pm k$ is not significantly smaller than the substrate size or the envisaged structures of the desired layer thickness profile in the direction of travel. In the coating range, the deposition rate is described by the function $R(x_k, x_m)$ or $R_g(x_k)*P_v(x_m)$. Basically, it would be possible to measure $R(x_k, x_m)$ by placing test substrates fixedly (without movement) statically under the cathode at different positions $x_m$ and after the deposition—by measuring the respective layer thickness profiles resulting at a sufficient number of measuring points $x_k$ (i.e., in the direction of travel). However, this approach is very complex. Experience with coating by, e.g., cathode sputtering shows namely that static coating profiles depend to a greater or lesser extent on the parameters determining the coating operation, such as, i.e., cathode power, gas pressure, target age. This approach would also be prone to errors, since the coating profile sought can also depend on the movement itself. Thus, in practice, it must be assumed that $R(x_k; x_m)$ or the two functions $R_g(x_k)$ and $P_v(x_m)$ are not known.

In a first preferred embodiment, the method according to the disclosure consists in that the function $R(x_k; x_m)$ is approximately described by a polynomial:

$$R(x_k; x_m) \approx \Sigma_{i,j} R_{ij}*x_k^i*x_m^j \quad (5a)$$

and the parameters or constants $R_{ij}$ are determined on the basis of measured values. However, the method will be explained in the following by means of a further implementation in which the functions $R_g(x_k)$ and $P_v(x_m)$ as well as subsequently $v(x_m)$ are approximately described by polynomials:

$$R_g(x_k) \approx R_g^\Sigma(x_k) = \sum_{i=0}^{iz} R_i * x_k^i \quad (5b)$$

$$P_v(x_m) \approx P_v^\Sigma(x_m) = 1 + \sum_{j=1}^{jz} P_j * x_m^j \quad (5c)$$

$$v(x_m) \approx v^\Sigma(x_m) = \sum_{l=0}^{lz} v_l * x_m^l \quad (5d)$$

and by respectively inserting these polynomials into equation (1c) instead of the original functions. The numbers iz, jz and lz have to be set appropriately. On the assumption that the parameters or constants $R_i$, $P_j$ and $v_l$ are known, the integral in equation (1c) can be calculated, e.g., by numerical methods. Programming can be carried out, for example, by means of the EXCEL spreadsheet program.

The step-by-step determination of the sought constants $v_l$ is first described in the following for the case that deviations from an (average) target layer thickness $d_z$ caused by the movement of the substrate are to be minimized.

Step 1: To this end, a coating operation is carried out and during this coating operation the substrate is moved through the coating range at a constant velocity $v_0$. The velocity $v_0$ is set such that the average layer thickness $d_m$ corresponds to the envisaged target layer thickness.

Step 2: The layer thickness $d_m(x_{s,h})$ on the substrate (the superscript "m" stands for measurement) is then measured at measuring points $x_{s,h}$ using a suitable method.

Step 3: At each of these points, the integral in equation (1d) is then numerically calculated using the polynomials $R_g^{\Sigma}(x_k)$, $P_v^{\Sigma}(x_m)$ and for a constant velocity $(v^{\Sigma}(x_m)=v_0)$, and the "approximate" layer thicknesses $d^s(x_{s,h})$ are determined therewith. First, iz=0 is set for this calculation, i.e., $R_g=R_0$ is constant. This restriction is based on equation (2), which shows that at a constant substrate velocity $v_0$ a position dependence of $R_g$ does not entail a position dependence of the layer thickness. The parameters $P_j$ are arbitrarily set in this step, e.g., $P_j=0$, j=1 ... 6, i.e., jz=6 Due to the fact that arbitrary constants are used in the polynomials $R_g^{\Sigma}(x_k)$ and $P_v^{\Sigma}(x_m)$, of course, these polynomials do not describe the unknown functions $R_g(x_k)$ and $P_v(x)$ in any way.

Step 4: Subsequently, the parameters $R_0$ and $P_j$, j=1 ... 6 are determined by variation so that the sum of the deviation squares $$\chi^2 = \sum_{h=0}^{m} [d^m(x_{s,h}) - d^s(x_{s,h})]^2 \to MIN! \quad (6a)$$

becomes minimal. Established iterative numerical methods can be used for the minimalization, such as, e.g., the simplex method. The calculation of all values of $d^s(x_{s,h})$ according to equation (1d) has to be carried out for each set of parameters until the minimum according to equation (6a) is reached. As a result of this minimalization, in particular the course of $P_v(x_m)$ is approximately available due to the now found values of $R_0$ and $P_j$, j=1 ... 6. The information for this approximation was obtained from the measured values $d^m(x_{s,h})$.

Step 5: Using these parameters now set, the velocity coefficients $v_l$, l=0 ... 6, i.e., lz=6, are determined, again by minimalization as described in detail in step 4, according to $$\chi^2 = \sum_{h=0}^{m} [d_Z - d^s(x_{s,h})]^2 \to MIN! \quad (6b)$$

Thus, the course of the velocity $v(x_m) \approx v^{\Sigma}(x_m)$ according to equation (5d) has been approximately found.

A new coating operation using the course of the velocity $v^{\Sigma}(x_m)$ shows that a clear improvement of the layer thickness uniformity is achieved already after this first optimization cycle, see FIG. 7a. If further optimization is required, steps 1 to 5 can be repeated. The values for $R_0$ and $P_j$, j=1 ... 6 as already known from the first pass as well as the velocity profile $v^{\Sigma}(x_m)$ with the parameters $v_l$, l=0 ... 6 as already obtained are then the starting point for this next run. Since now the velocity of the substrate is no longer constant and thus the prerequisite of a constant substrate velocity is no longer true (see equation (2)), the parameters $R_i$, i=1 ... 6 can now also be included in the minimalization operation, see FIG. 7a.

The determination of the constants $v_l$ for the case that a predetermined layer thickness profile in the direction of travel of the substrate is to be generated by the coating operation by means of a variable velocity is performed in a way analogous to that for the constant layer thickness by executing steps 1 to 5. However, the minimalization for determining the velocity coefficients must now be carried out by means of $$\chi^2 = \sum_{h=0}^{m} [d_p(x_{s,h}) - d^s(x_{s,h})]^2 \quad (6c)$$

instead of equation (6b). $d_p(x_{s,h})$ is the layer thickness at the measuring points $x_{s,h}$ as they result from the predetermined layer thickness profile.

For the approximate determination of $R(x_k; x_m)$ or the two functions $R_g(x_k)$ and $P_v(x_m)$ as well as of $v(x_m)$, other suitable functions can also be used. In the linear case according to equations (5b) to (5d), for example, a cubic splines algorithm is an appropriate option, in which both the nodes and the constants of the cubic segments can be used for a fit according to equation (6b) and equation (6c). In each case, criteria for the selection of approximation functions will be that a good description of the unknown original functions can be achieved with as few parameters as possible.

FIGS. 4a to 4e schematically illustrate the proportions of some dimensions or lengths characteristic of, for example, the LDD coating operation in various exemplary situations. The reference signs 1 and 2 (according to FIG. 1) denote the substrate and the sputtering cathode, respectively. The reference sign 6 indicates the static deposition rate distribution, which depends, i.e., on the cathode width. Since the proportions are discussed herein using the example of the LDD coating operation, all sizes refer to the direction of movement of the substrate 1 relative to the cathode 2. The reference sign B denotes the extension of the coating range along the direction of movement (cf. also FIG. 1a). The same applies to the dimension D of the substrate 1.

Figure 4A:
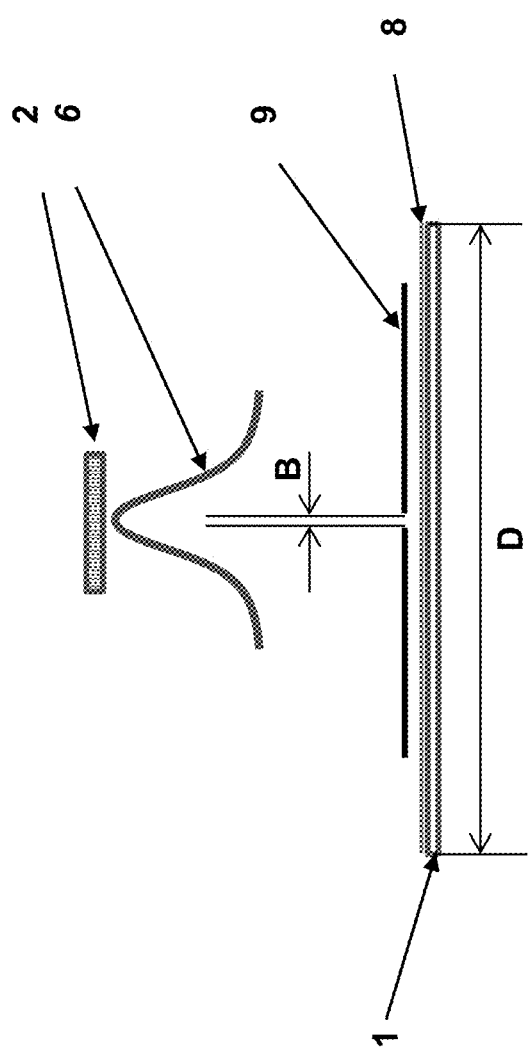
FIG. 4a schematically shows the relevant proportions during an LDD coating operation.

FIG. 4a shows the case of an ideal "line source", which can only be implemented by special slit diaphragms (reference sign 9) directly above the substrate. In this case, the relation B<<D holds. The reference sign 8 denotes the layer or the layer thickness profile. In such an arrangement, a large part of the material flow from the target to the substrate is "screened out". This leads to an extremely low deposition rate in combination with a large loss of material due to the slit diaphragms. Therefore, this arrangement is hardly used in practice. As explained above, this case is included as a special case in the presented technique.

Figure 4B:
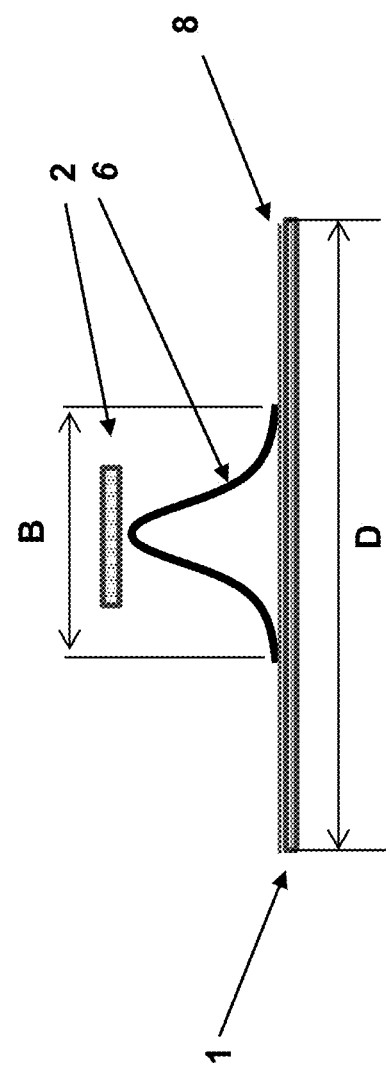
FIG. 4b schematically shows the relevant proportions during an LDD coating operation.
Figure 4C:
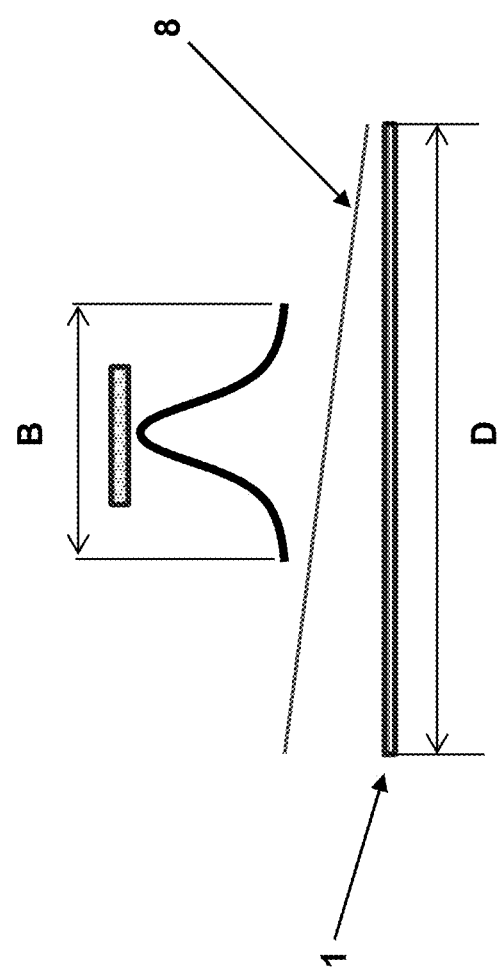
FIG. 4c schematically shows the relevant proportions during an LDD coating operation.

In FIGS. 4b, 4c a typical deposition rate 6 (e.g., similar to a Gaussian distribution) is shown. FIG. 4b shows the case of a constant target layer thickness 8, in which a maximum degree of layer thickness uniformity is aimed at. FIG. 4c shows the case in which a linear increase 8 (greatly exaggerated in the Figure for the sake of illustration) of the layer thickness over the entire substrate width is to be produced with a deviation of the layer thickness from this linear profile as small as possible. In both cases, the relation B≈D holds.

Figure 4D:
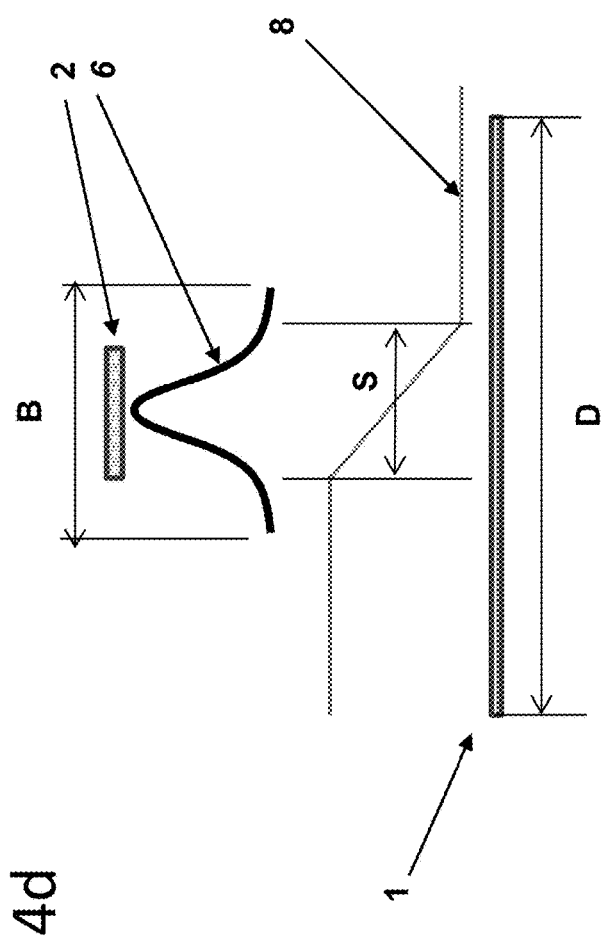
FIG. 4d schematically shows the relevant proportions during an LDD coating operation.
Figure 4E:
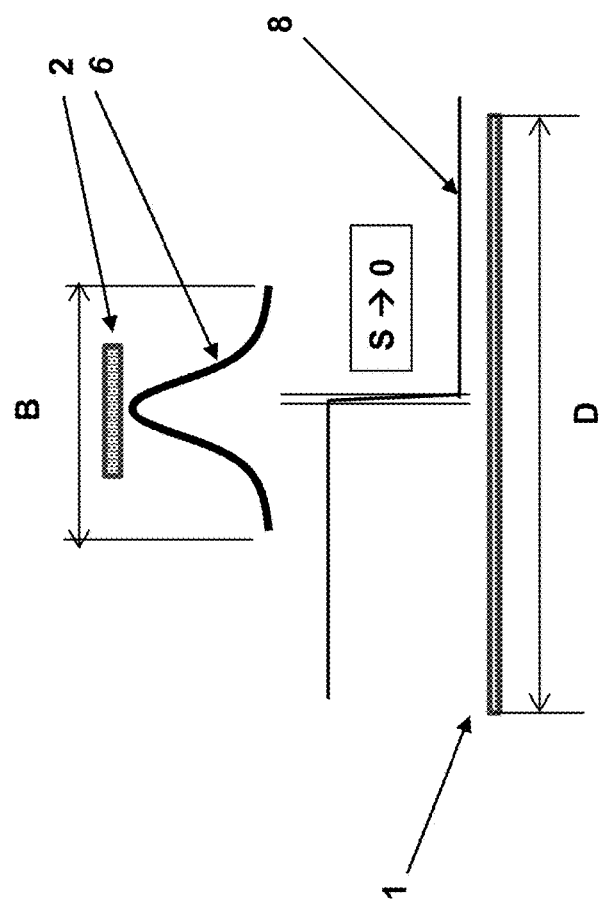
FIG. 4e schematically shows the relevant proportions during an LDD coating operation.

FIGS. 4d to 4e exemplarily show alternative layer thickness target profiles 8 (greatly exaggerated in the Figures for the sake of illustration). These profiles are typically characterized by a characteristic length S which is smaller than the dimension D of the substrate 1. In the case of FIG. 4d, this characteristic length S is smaller than the coating range B, but still in the same order of magnitude. The layer thickness target profile 8 of FIG. 4e, on the other hand, has a sharp edge or step for which the characteristic length S of the layer thickness target profile approaches zero: S→0.

As is readily apparent from FIG. 4e, a precise step profile with a perfectly sharp edge cannot be achieved with a cathode that has an extended coating range, i.e., if B>>S. The coating operation with an extended coating range would lead to a "softening" of the step in the deposited profile. Such profiles can only be generated with the aid of an (ideal) line source with B→0 (see FIG. 4a). However, the present disclosure enables the layer thicknesses of profiles with correspondingly large characteristic lengths to be manufactured efficiently with maximum precision, even with large coating ranges, i.e., B≈D.

The fact that this is not possible using conventional methods, such as those described, for example, in DE 10 2006 036 403 A1, is illustrated once again in FIGS. 5a to 5c, which show that a velocity profile $v(x_m)$ cannot be determined, not even approximately, with a simple method applicable only for ideal line sources according to FIG. 4a. In the case of an extended substrate area, the substrate is already coated here when the front edge of the extended substrate is not yet below the cathode center (cf. FIG. 5a). Thus, the determination of the velocity on the basis of a different layer thickness below the arrow (reference sign 10) is not possible. FIGS. 5b and 5c show the passage of the substrate 1 through the extended coating range B.

Figure 3:
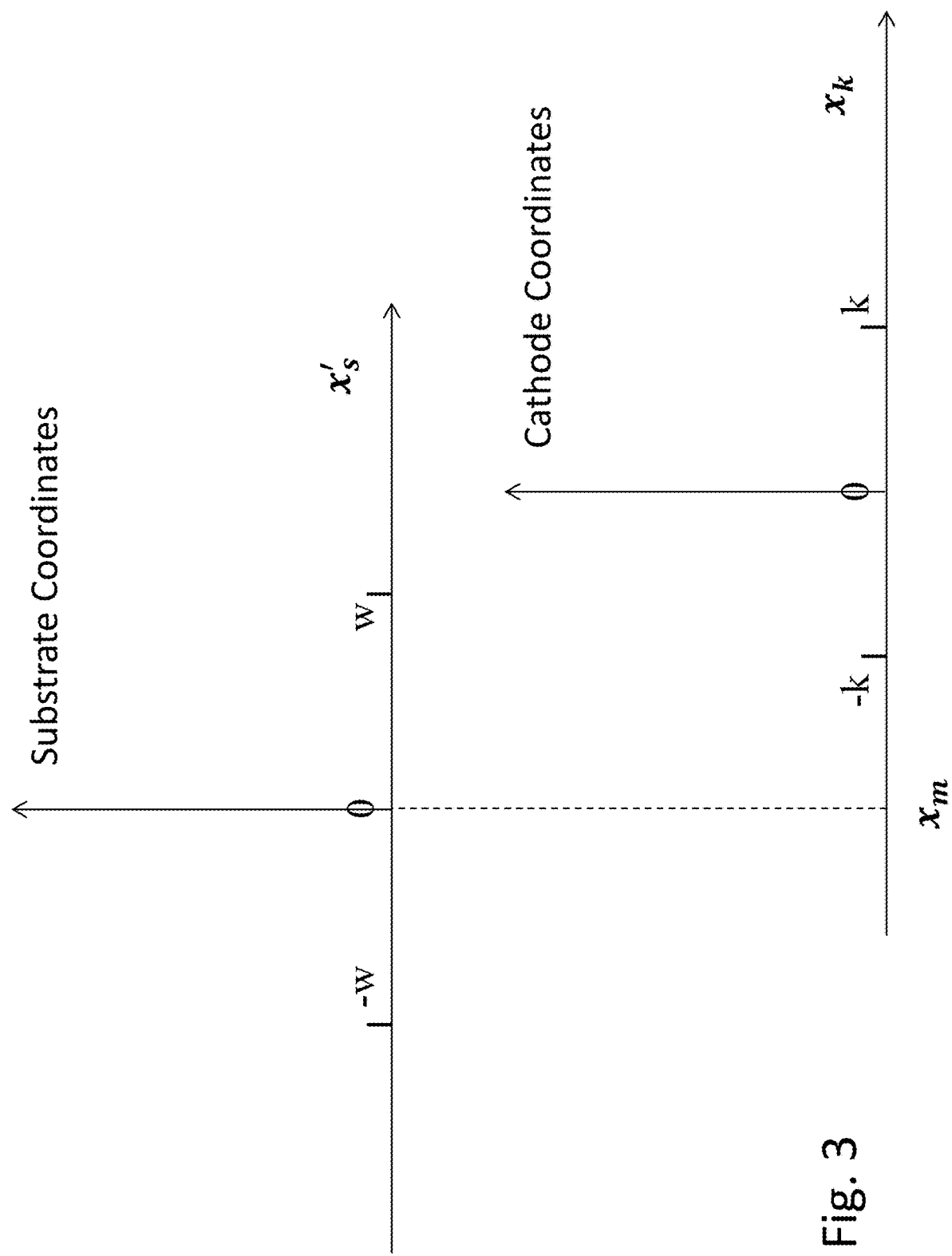
FIG. 3 shows the coordinate systems used in the context of the present disclosure.

FIGS. 6 and 7 exemplarily show the results of an optimization according to the disclosure for the case of a constant target layer thickness, with the values k=70 mm (i.e., with a coating range having a width of 140 mm, cf. FIG. 2) and w=50 mm (i.e., a substrate extension of 100 mm, cf. FIG. 3). The "measured value" $d^m(x_{s,h})$ were auxiliary calculated using a simulation function $R(x_k; x_m)$. The dependence of this simulation function is based on calculation methods for the deposition rate of longitudinal cathodes (see, e.g., "Schichtdickengleichmäβigkeit" von aufgestäubten Schichten—Vergleich zwischen Berechnungen und praktischen "Ergebnisse" (Layer Thickness Uniformity of Sputtered Layers—Comparison between Calculations and Practical Results), G. Deppisch, Vakuumtechnik 30 (1981) 106). The initial function thus determined for the "measure" layer thickness for a constant, non-optimized velocity profile is shown in FIG. 7a (diamond-shaped symbols).

Figure 6A:
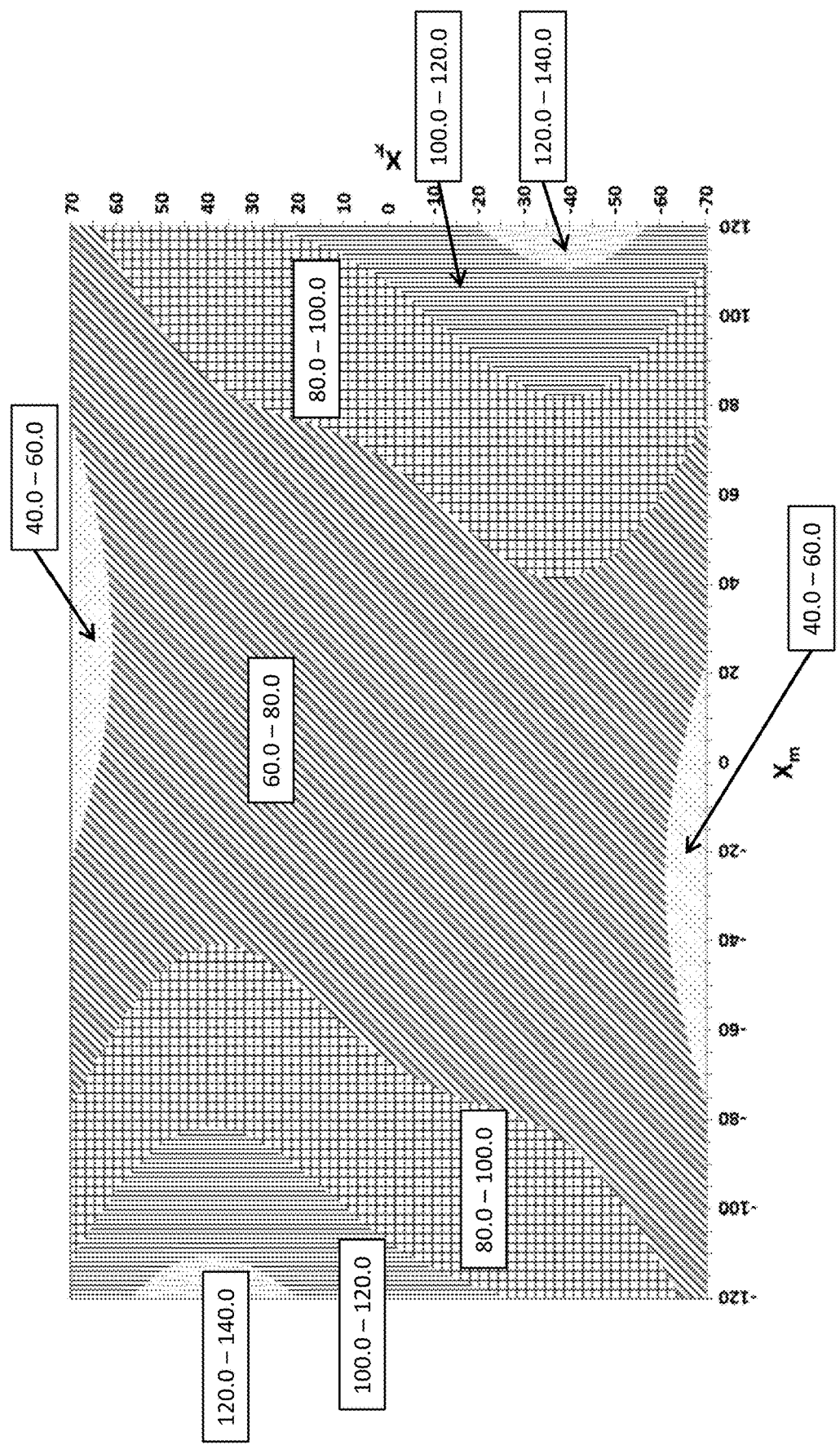
FIG. 6a shows a contour plot of R(x_m; x_k) from a simulation calculation.
Figure 6B:
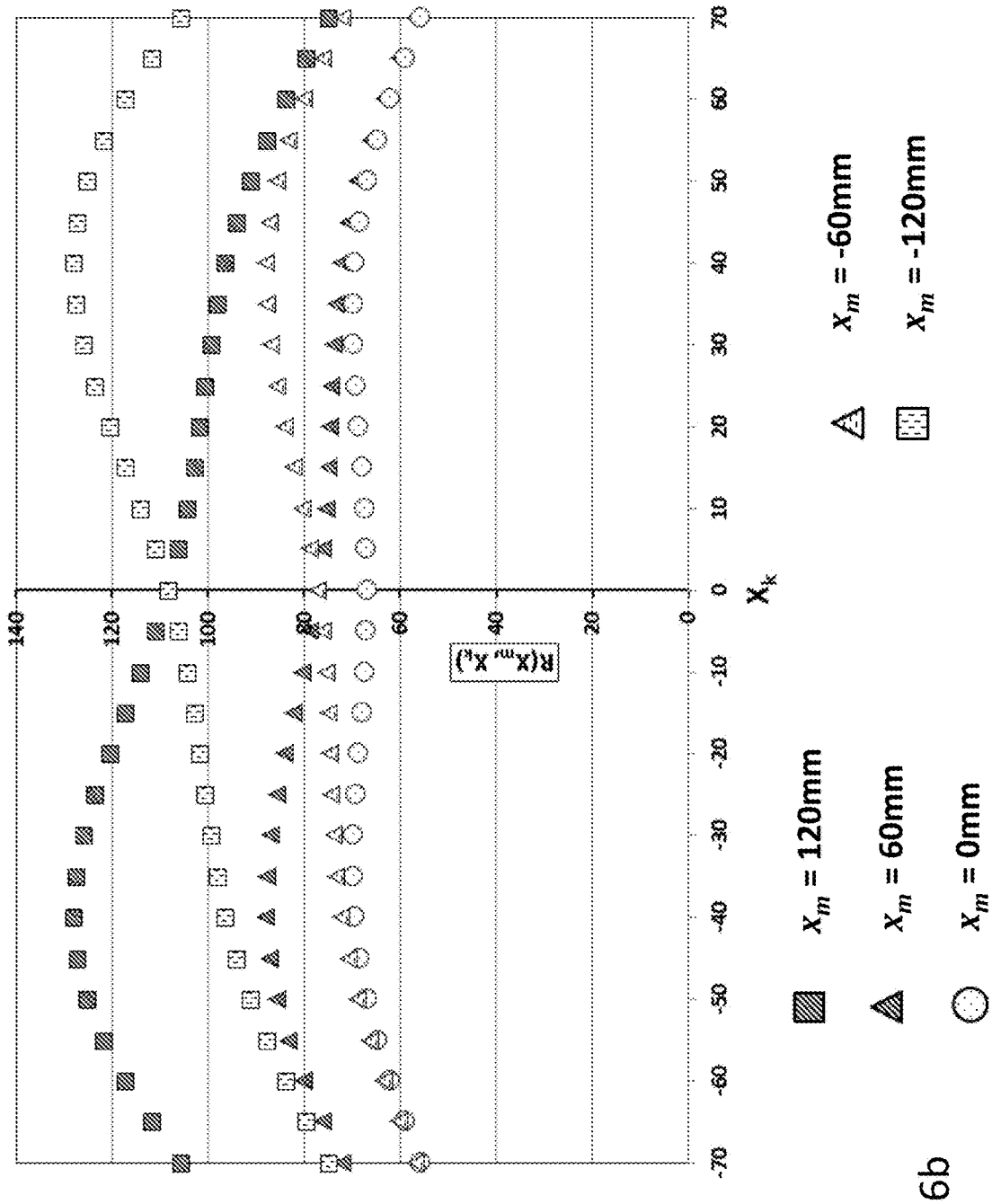
FIG. 6b shows values of R(x_m; x_k) for various x_m from a simulation calculation.
Figure 7B:
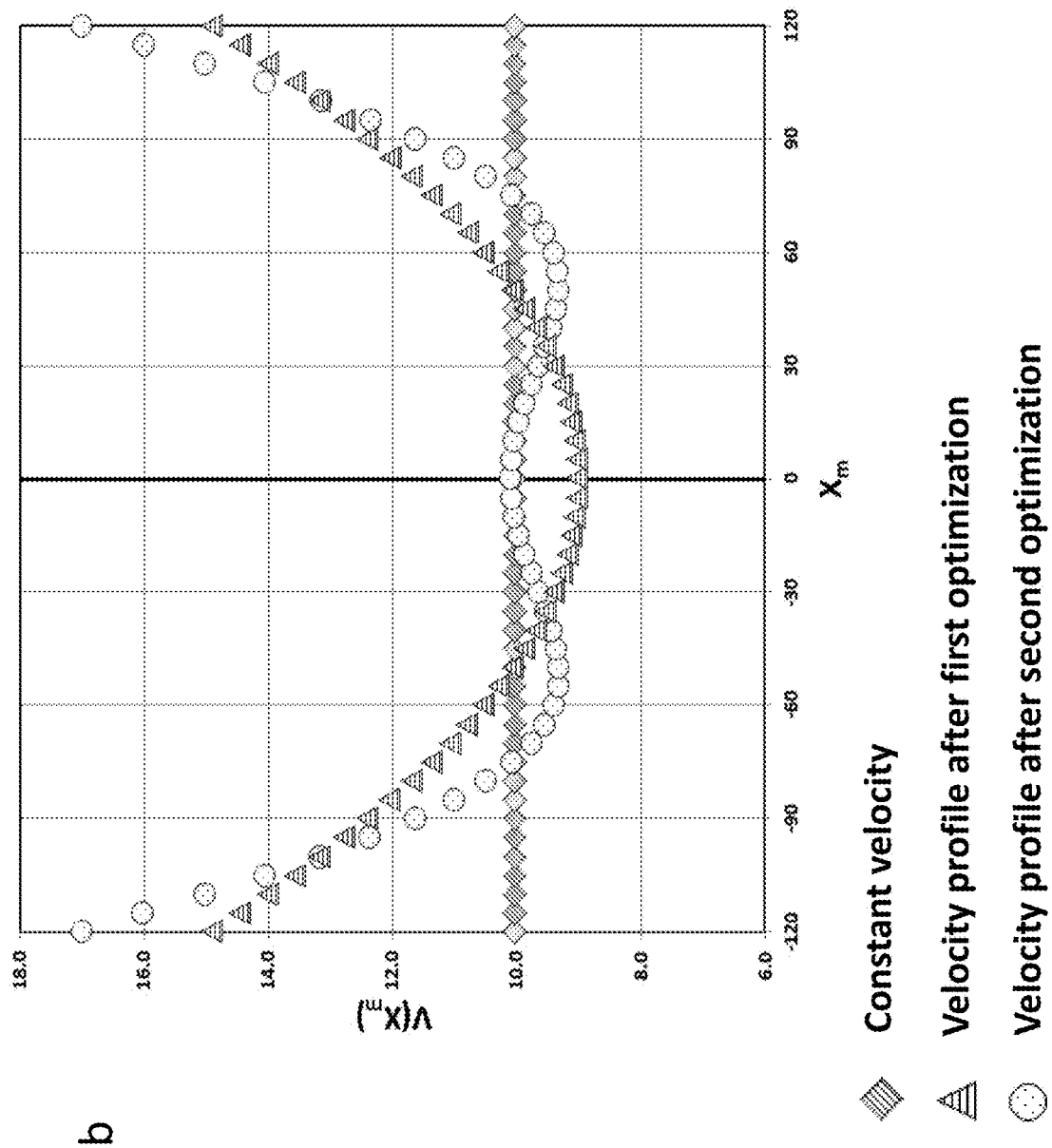

FIG. 6a shows the "contour plot" of the thus determined values of $R(x_k; x_m)$. In order to illustrate the good functioning of the method according to the disclosure, the effect of the substrate movement, i.e., the dependence R on $x_m$ is greatly exaggerated. In the case of this simulation, the minimum values of R are approximately 50 (arbitrary units) and the maximum values are 130. In LDD practice, such a great change in the rate R due to the substrate movement is normally not observed. In addition to FIG. 6a, FIG. 6b shows the course of $R(x_k; x_m)$ for different values $x_m$. FIG. 7a shows the "measure" layer thickness as a result of optimization in the order without optimization, after first optimization and after second optimization. Despite the great exaggeration of the dependence of the rate R on $x_m$, a degree of layer thickness uniformity of 0.21% is achieved already after the second optimization step. FIG. 7b shows the velocity profiles corresponding to FIG. 7a.

What is claimed is:

1. A method of determining a velocity profile for the movement of a substrate to be coated relative to a coating source during a coating operation of the substrate in order to achieve a defined target layer thickness profile, wherein the method comprises the steps of:
    (a) describing a deposition rate, wherein the deposition rate is the rate at which the coating is applied to the substrate, and wherein the deposition rate is described by an approximation function comprising a product of at least two functions depending on the substrate coordinates and depending on the position of the substrate relative to the coating source, wherein the product of at least two functions comprises several parameters;
    (b) describing the velocity profile to be determined by an approximation function comprising one or more parameters;
    (c) coating the substrate using a defined velocity profile, wherein the substrate to be coated is moved during the coating operation relative to the coating source in a straight line along a first direction using this velocity profile;
    (d) measuring the actual layer thickness profile of the coated substrate achieved by the coating operation;
    (e) determining one or more of the parameters of the approximation function for the deposition rate on the basis of a comparison of the measured actual layer thickness profile with the defined target layer thickness profile; and
    (f) determining the velocity profile by determining one or more of the parameters of the approximation function for the velocity profile to be determined on the basis of the parameter(s) determined in step (e).

2. The method according to claim 1, wherein the coating operation is carried out by the coating source in a coating range, wherein the coating range has a first extension in the first direction, and wherein the first extension is at least 100 mm.

3. The method according to claim 1, wherein the defined target layer thickness profile is a constant layer thickness, and wherein the coating operation is carried out by the coating source in a coating range, wherein the coating range has a first extension in the first direction, and the substrate has a second extension in the first direction of movement, and wherein the ratio of the first extension to the second extension is at least 0.2.

4. The method according to claim 1, wherein the defined target layer thickness profile is a variable layer thickness, wherein the coating operation is carried out by the coating source in a coating range, wherein the coating range has a first extension in the first direction, and wherein the defined target layer thickness profile has a profile length along this first direction of movement, and wherein the ratio of the first extension to the profile length is at least 0.2.

5. The method according to claim 1, wherein, as one factor, the product contains a function which accounts for the geometry and depends on the coating source coordinates and is independent of the position of the substrate relative to the coating source, and wherein, as a further factor, the product contains a function which accounts for the movement of the substrate and depends on the position of the substrate relative to the coating source and is independent of the coating source coordinates.

6. The method according to claim 1, wherein the at least two functions are each described by an approximation function comprising one or more parameters.

7. The method according to claim 1, wherein steps (a) to (f) are repeated, wherein the parameters of the previous run determined in step (e) are used in step (a) of the subsequent run, and the defined velocity profile in step (c) of the subsequent run corresponds to the velocity profile determined in step (f) of the previous run.

8. The method according to claim 7, wherein steps (a) to (f) are repeated until the deviation between the measured actual layer thickness profile of the coated substrate and the defined target layer thickness profile is less than 1.0%.

9. A method of coating a substrate comprising the steps of:
(a) determining a velocity profile for the movement of the substrate to be coated relative to a coating source in order to achieve a defined target layer thickness profile according to any one of the preceding claims; and
(b) coating the substrate using the previously determined velocity profile, wherein the substrate to be coated is moved during the coating operation relative to the coating source in a straight line along a first direction using this velocity profile.

10. The method according to claim 9, wherein the defined target layer thickness profile is a constant layer thickness, and wherein the determined velocity profile is not constant.

11. The method according to claim 9, wherein the deposition rate of the coating source depends on the position of the substrate relative to the coating source, and wherein the determined velocity profile is configured such that a variation in the deposition rate of the coating source is at least partially compensated for by a variation in the velocity of the substrate.

12. The method according to claim 9, wherein a layer thickness non-uniformity generated by the dependence of the deposition rate of the coating source on the position of the substrate relative to the coating source is at least partially compensated for by the predetermined velocity profile.

13. A device for coating a substrate comprising:
a coating source;
a substrate support adapted to move the substrate to be coated relative to the coating source in a straight line along a first direction during a coating operation; and
a control unit adapted and configured to vary the velocity of the substrate along the first direction during the coating operation according to a predetermined velocity profile depending on the position of the substrate in order to obtain a coating having a target layer thickness profile defined along the first direction,
wherein the control unit is adapted and configured to determine the predetermined velocity profile according to a method which comprises the steps of:
(a) describing a deposition rate, wherein the deposition rate is the rate at which the coating is applied to the substrate, and wherein the deposition rate is described by an approximation function comprising a product of at least two functions depending on the substrate coordinates and depending on the position of the substrate relative to the coating source, wherein the product of at least two functions comprises several parameters;
(b) describing the velocity profile to be determined by an approximation function comprising one or more parameters;
(c) coating the substrate using a defined velocity profile, wherein the substrate to be coated is moved during the coating operation relative to the coating source in a straight line along a first direction using this velocity profile;
(d) measuring the actual layer thickness profile of the coated substrate achieved by the coating operation;
(e) determining one or more of the parameters of the approximation function for the deposition rate on the basis of a comparison of the measured actual layer thickness profile with the defined target layer thickness profile; and
(f) determining the velocity profile by determining one or more of the parameters of the approximation function for the velocity profile to be determined on the basis of the parameter(s) determined in step (e).

14. The device according to claim 13, wherein the coating operation is carried out by the coating source in a coating range, wherein the coating range has a first extension in the first direction, and wherein the first extension is at least 200 mm.

15. The device according to claim 13, wherein the coating operation is carried out by the coating source in a coating range, wherein the coating range has a first extension in the first direction, wherein the first extension is at least 300 mm.

16. The device according to claim 14, wherein the defined target layer thickness profile is a constant layer thickness, and wherein the coating operation is carried out by the coating source in a coating range, wherein the coating range has a first extension in the first direction, and the substrate has a second extension in the first direction, and wherein the ratio of the first extension to the second extension is at least 0.3.

17. The device according to claim 16, wherein the defined target layer thickness profile is a constant layer thickness, wherein the ratio of the first extension to the second extension is at least 0.5.

18. The device according to claim 17, wherein the ratio of the first extension to the second extension is at least 1.0.

19. The method according to claim 1, wherein the coating operation is carried out by the coating source in a coating range, wherein the coating range has a first extension in the first direction, and wherein the first extension is at least 50 mm.

* * * * *